Figure 1:
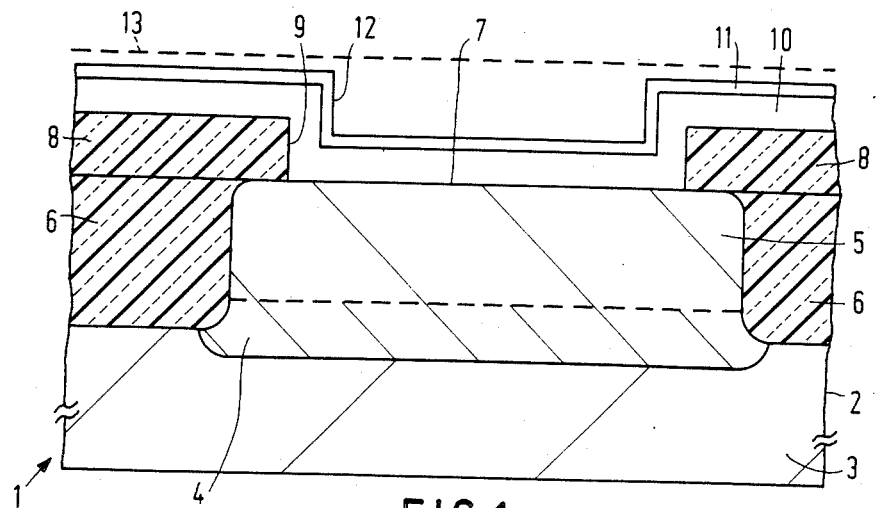

United States Patent [19]

Appels et al.

[11] Patent Number: 4,689,872

[45] Date of Patent: Sep. 1, 1987

[54] METHOD OF MANUFACTURING A SEMICONDUCTOR DEVICE

[75] Inventors: Johannes A. Appels; Henricus G. R. Maas, both of Eindhoven, Netherlands

[73] Assignee: U.S. Philips Corporation, New York, N.Y.

[21] Appl. No.: 771,930

[22] Filed: Sep. 3, 1985

[30] Foreign Application Priority Data

Sep. 18, 1984 [NL] Netherlands ......................... 8402856

[51] Int. Cl.[4] .................. H01L 21/22; H01L 21/265; H01L 21/318
[52] U.S. Cl. .......................... 437/228; 148/DIG. 11; 148/DIG. 51; 148/DIG. 103; 156/643; 156/648; 156/653; 156/662; 437/31; 437/20; 437/41
[58] Field of Search ............... 156/643, 648, 653, 657, 156/659.1, 661.1, 662; 148/187, 188, DIG. 11, DIG. 43, DIG. 51, DIG. 103, DIG. 117, DIG. 122, DIG. 131, DIG. 106; 29/576 R, 578, 580; 427/93, 94, 84, 97; 357/23.3, 50, 59 H, 68

[56] References Cited

U.S. PATENT DOCUMENTS

| | | | |
|---|---|---|---|
| 3,886,569 | 5/1975 | Basi et al. | 148/DIG. 43 |
| 4,074,304 | 2/1978 | Shiba | 357/59 H |
| 4,113,533 | 9/1978 | Okumura et al. | 148/187 |
| 4,305,760 | 12/1981 | Trudel | 156/657 |
| 4,481,706 | 11/1984 | Roche | 29/577 C |
| 4,506,437 | 3/1985 | Godejahn | 156/653 |
| 4,507,171 | 3/1985 | Bhatia et al. | 156/643 |
| 4,545,114 | 10/1985 | Ito et al. | 29/579 |

OTHER PUBLICATIONS

IBM TDB, vol. 27, No. 2, Jul. 1984, Shepard, "Self-Aligned Bipolar Transistor", pp. 1008-1009.

Primary Examiner—S. Leon Bashore
Assistant Examiner—Andrew J. Anderson
Attorney, Agent, or Firm—Paul R. Miller

[57] ABSTRACT

For providing semiconductor zones (16, 18, 26) and contact metallization (19, 27) within an opening (9) in a self-registered manner, which opening is provided along its edge with polycrystalline connection parts (10) separated by an insulating material (15) from the metallization (19, 27), a protective layer (11) is formed which is maintained within the opening (9) until within this opening (9) the connection parts (10) are formed by anisotropic etching from a uniform layer of polycrystalline semiconductor material (10). The method is suitable for the manufacture of both bipolar transistors and field effect transistors.

4 Claims, 6 Drawing Figures

METHOD OF MANUFACTURING A SEMICONDUCTOR DEVICE

The invention relates to a method of manufacturing a semiconductor device, in which at least along an edge of an opening in an insulating layer provided on a semiconductor body at least a part of an interconnection pattern is formed, while within the opening the semiconductor surface free of the part of the interconnection pattern is exposed at least in part and the part of the interconnection pattern is provided with insulating material, which in a next processing step forms a part of a mask.

The invention further relates to a device manufactured by means of a method according to the invention.

When designing semiconductor devices, increasingly higher integration densities are attempted on the one hand in order to be able to realize an increasingly larger number of functions on the same surface and on the other hand in order to be able to attain higher yields in the manufacture due to the smaller surface area of the circuit to be manufactured. Especially due to the rise of microprocessors and minicomputers, more stringent requirements are increasingly imposed with respect to high speed and small dimensions of the circuit elements. Consequently, increasingly more stringent requirements are imposed on the minimum dimensions to be realized, such as track widths of metallization patterns, relative distances of contact holes, minimum widths of insulation regions, etc.

Since these dimensions are determined for the major part by the masking techniques used, there is an increasing interest in finding methods, in which these dimensions are not dependent upon optical resolutions. Self-registering techniques are especially to be preferred.

A method of the kind mentioned in the opening paragraph is known from IBM Technical Disclosure Bulletin, Vol. 27, No. 2, p. 1008–9. However, this publication does not disclose sufficiently especially the precise manner in which the oxide is formed.

A method according to the invention is characterized in that the semiconductor device is covered at least at the area of the opening by a substantially uniform layer of a first semiconductor material, which is covered by a substantially uniform layer of oxidation-preventing material, after which the oxidation-preventing material is removed selectively at least outside the opening and the parts of the first semiconductor material thus exposed are oxidized over a portion of their thickness, whereupon within the opening the oxidation-preventing material is removed and the first semiconductor material is then removed by anisotropic etching so that at least parts of the first semiconductor material belonging to the interconnection pattern remain along the edge of the opening.

In Netherlands Patent Application No. 8402859, corresponding to U.S. Ser. No. 776,330, filed Sept. 16, 1985, and filed simultaneously with the present Application a similar method is used inter alia for defining grooves. It has now been found that this method may also be advantageously used in the method mentioned in the opening paragraph.

By the mask thus obtained, inter alia a metal contact may be provided, which consequently now directly contacts the semiconductor body at the area of a transistor zone to be formed.

A substantially uniform layer is to be understood herein to mean a layer having substantially the same thickness throughout its area except areas at which an unevenness, such as, for example a step, is present in the underlying layer and the uniform layer has the same profile as the underlying layer.

The term "opening" or "depression" is not necessarily to be understood to mean an opening in the insulating layer, which is enclosed on all sides by this insulating layer. An insulating layer may also be used, which does not cover, for example, an outer edge of the semiconductor body.

The invention is based on recognition of the fact that in this manner mask openings can be realized which have very small dimensions, which is advantageous especially for integrated circuits having high packing densities.

The mask manufactured by means of the method according to the invention may be used, for example, for providing an emitter zone in a self-registered manner, which step may be preceded, if required, by the step of forming a base zone. Furthermore, a thin layer of gate oxide can be formed in the original opening and is removed afterwards at the area of the mask, after which by means of this mask a source or drain zone of a field effect transistor can be realized by diffusion or implantation. Contacting of this source or drain zone can then again be effected by means of the same mask.

Figure 2:
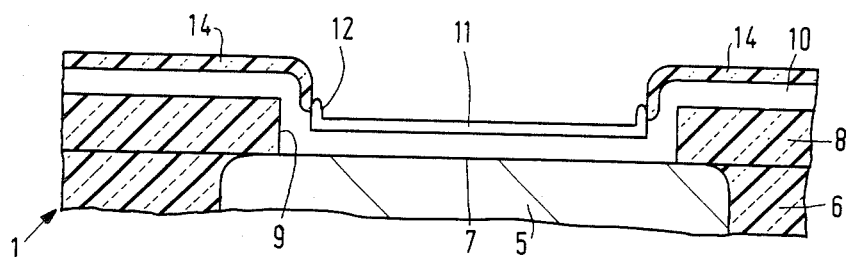
Figure 3:
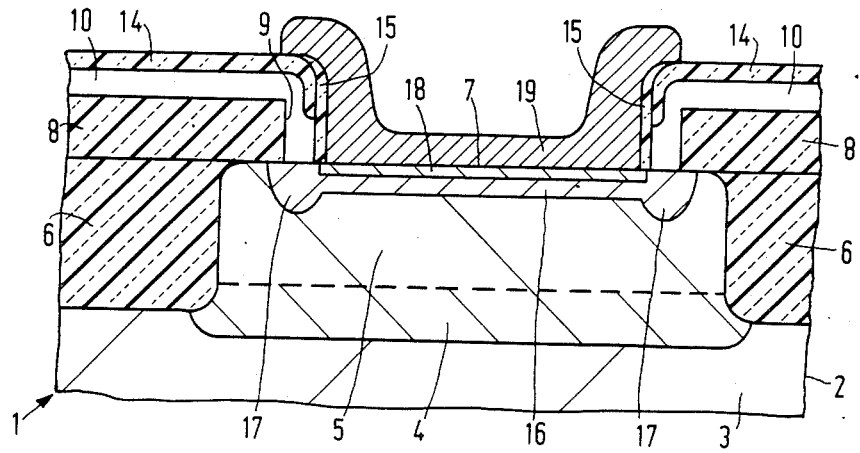
Figure 4:
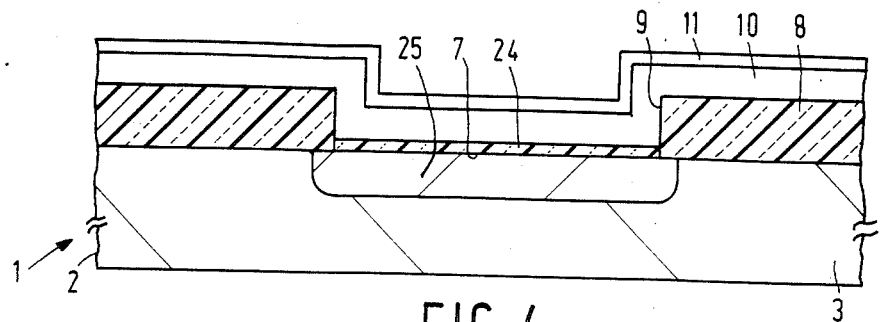
Figure 5:
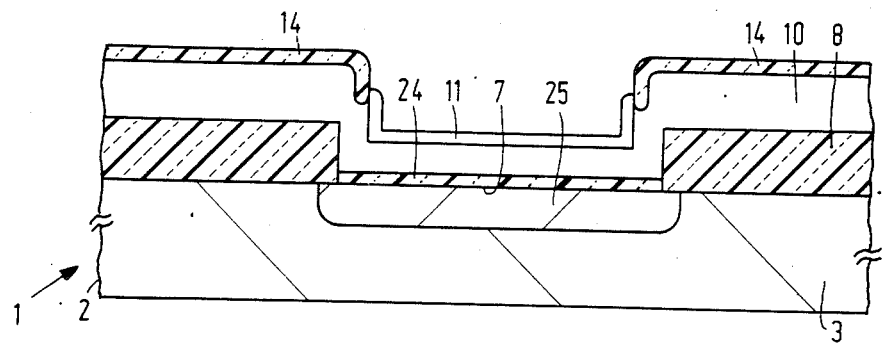
Figure 6:
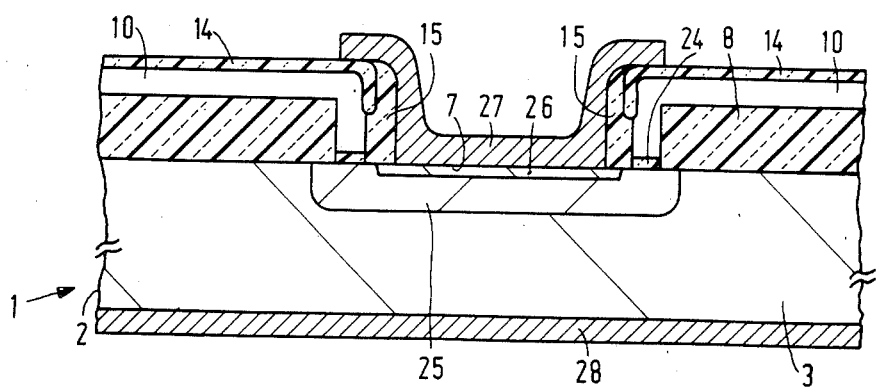

The invention will now be described more fully with reference to a few embodiments and the drawing, in which:

FIGS. 1 to 3 show the manufacture of a bipolar transistor having a very small base-emitter capcitance by means of a method according to the invention, while FIGS. 4 to 6 show a method according to the invention of manufacturing a field effect transistor.

The Figures are not drawn to scale, while for the sake of clarity in the cross-sections especially the dimensions in the direction of thickness are greatly exaggerated. Semiconductor zones of the same conductivity type are generally cross-hatched in the same direction; in the Figures, corresponding parts are generally designated by the same reference numerals.

FIGS. 1 to 3 illustrate a method according to the invention of manufacturing a semiconductor device 1. The starting material is a semiconductor body 2 having a substrate 3 of the p-type of 2–5 $\Omega$.cm resistivity. After this substrate has been provided in a well known manner with an n+ buried layer 4 and an n-type epitaxial layer 5, regions electrically isolated from each other are defined for circuit elements. This may be effected by so-called junction isolation, but is preferably effected by means of a dielectric insulation 6, as described, for example, in Netherlands Patent Application No. 8203903.

The surface 7 of the semiconductor body 2, which, when such a technique is used, is substantially flat, is then covered by an insulating layer 8 of, for example, silicon oxide, which is provided with an opening 9, within which the epitaxial material 5 at the semiconductor surface 7 is exposed.

On the part of the surface 7 located within the opening 9 and on the adjoining part of the oxide layer 8 is now provided a substantially uniform layer 10 of polycrystalline silicon. This is effected, for example, by deposition at low pressure from the vapour phase; as a result, a substantially uniform coating of the device with a layer of polycrystalline silicon of about 0.4 $\mu$m thickness is obtained, which has within the opening 9 a depression 12 with substantially perpendicular side walls (see FIG. 1). The layer 10 of polycrystalline silicon is in this embodiment of the p-type and may act, if desired, at a later stage as a diffusion source for a semiconductor zone to be formed.

By means of techniques similar to those used for providing the layer 10, a substantially uniform layer 11 of silicon nitride having a thickness of about 0,1 μm is then formed on the device. Thus, the device of FIG. 1 is obtained, which is then entirely covered with photolacquer and is subsequently subjected to a planarization treatment, indicated diagrammatically by the broken line 13.

In a next processing step, the photolacquer together with the nitride 11 is etched back by means of reactive ion etching. The etching rate of the photolacquer may be higher than that of the nitride provided that after removal of the nitride 11 located outside the depression 12, nitride still remains on the polycrystalline silicon 10 located within this depression. After the photolacquer remaining in the depression 12 has been removed by means of wet-chemical etching, the remaining nitride 11 protects in a next oxidation step the subjacent polycrystalline silicon 10 against oxidation. In this oxidation step, the exposed polycrystalline silicon 10 is provided with a protective layer 14 of silicon oxide. Thus, the device of FIG. 2 is obtained.

Within the depression 12, an edge 15 of insulating material is now formed; thus, a mask is obtained for a next processing step, for example to define a transistor zone or to provide a contact metallization. In order to form the edge 15, the remaining nitride 11 is first removed, for example by wet-chemical etching in phosphoric acid. Subsequently, the polycrystalline silicon 10 thus exposed is removed at the area of the depression 12 by means of anisotropic etching (reactive ion etching or plasma etching) so that the semiconductor surface 2 is exposed in situ.

The device thus obtained is then covered by a substantially uniform layer of silicon oxide, of which the edges 15 within the depression 12 remain after an anisotropic etching treatment in a plasma, which edges cover the polycrystalline silicon 10. Preferably, a boron implantation is carried out beforehand at an energy of 25 keV and a dose of $10^{14}$ atoms/cm$^2$ for forming the base zone 16. This base zone is contacted by means of the polycrystalline connection tracks 10. During the successive processing steps, a part of the acceptors diffuses from these connection tracks 10 into the semiconductor body 2 and forms the base contact zones 17 therein.

The oxide edge 15 now forms within the depression 12 a mask for providing an emitter zone 18 by means of implantation or diffusion and for subsequently providing an emitter metallization 19 by a metallization step. Thus, an npn transistor is formed (FIG. 3). The n-type region 5 then acts as the collector and is contacted, for example, by the buried layer 4 and a collector contact diffusion located outside the plane of the drawing.

With reference to FIGS. 4 to 6 there will be illustrated how a field effect transistor can be manufactured by means of the method according to the invention.

The device 1 comprises a semiconductor body 2 having an n-type substrate 3, which is provided at a surface with a layer of insulating material (for example silicon oxide) in which an opening 9 is formed. Within the opening 9 the surface 7 is covered by a thin layer 24 of oxide, of which parts will later form the gate oxide. Through this opening 9 the substrate 3 is also provided by diffusion or implantation with a p-type gate region 25.

At the area of the opening 9 the device is covered by a substantially uniform double layer of p-type polycrystalline silicon 10 and nitride 11 (FIG. 4), after which again the nitride 11 is covered by photolacquer, planarization and back-etching is performed, the nitride again being maintained within the depression 12 (FIG. 5) and protecting the device at the area of the depression 12 against oxidation during the formation of the layers 14 of thermal oxide.

Within the depression 12, in the same manner as described with reference to FIGS. 2 and 3, again the nitride is removed and the polycrystalline silicon 10 is removed by anisotropic etching, like a part of the gate oxide 24, until the semiconductor surface 7 is exposed. Along the edges of the opening there are still present perpendicular parts of the polycrystalline silicon 10, which are separated by gate oxide 24 from the subjacent channel region 25. Subsequently, the device is covered by a substantially uniform layer of silicon oxide, of which the edges 15 remain after an anisotropic etching treatment, these edges covering the polycrystalline silicon 10 and forming together with the oxide 14 a mask for next processing steps. By means for this mask, a source zone 26 is then formed by diffusion or implantation of, for example, phosphorus, while through the same mask a source contact 27 is formed. The substrate 3 acts as a drain zone in the transistor thus formed and is contacted, for example, on the lower side by means of a metallization 28.

The MOS transistor thus formed has the advantage of a channel doping which, viewed in the lateral direction, is substantially homogeneous and of an extremely short channel ($<1$ μm). Moreover, the capacitance between the gate electrode and the drain zone is substantially negligible.

Of course the invention is not limited to the embodiment described herein, but various modifications are possible within the scope of the invention. For example, the MOS transistor of FIG. 6 may have for applications in integrated circuits a drain contact at the surface 7 instead of the said metallization 28.

In the embodiments shown, the conductivity types may be inverted (simultaneously), while furthermore for the semiconductor materials used other materials may be chosen, such as materials of the $A^{III}B^V$ type.

Besides, various modifications are possible in the processing.

What is claimed is:

1. A method of manufacturing a semiconductor device comprising the steps of
    forming an insulating layer on a surface of a semiconductor body, said insulating layer having an opening to said surface;
    providing a substantially uniform layer of a first semiconductor material over said insulating layer and said surface in said opening;
    covering said first semiconductor material with a substantially uniform layer of an oxidation preventing material;
    selectively removing portions of said oxidation preventing layer, said portions being free of said opening;
    oxidizing exposed portions of said first semiconductor material over a part of the thickness of said first semiconductor material;

removing remaining portions of said oxidation preventing layer in said opening;

anisotropically etching at least parts of said first semiconductor material in said opening, said first semiconductor material remaining along edges of said opening;

oxidizing said first semiconductor material remaining along said edges of said opening to form a mask; and exposing said surface of said semiconductor body in said opening to semiconductor ions through said mask to form portions of a semiconductor device.

2. A method according to claim 1, wherein said semiconductor ions provide both base zone doping and emitter zone doping through said mask to form a bipolar transistor.

3. A method according to claim 1, wherein said surface of said semiconductor body within said opening is covered with a thin layer of field oxide before providing said first semiconductor material, and said semiconductor ions provide source zone doping to form a field effect transistor after removing a part of said thin layer in said opening.

4. A method according to claim 1 or claim 2 or claim 3, wherein said anisotropic etching of said first semiconductor material is carried out by a plasma.

* * * * *